United States Patent
Kim

(10) Patent No.: US 6,900,887 B2
(45) Date of Patent: May 31, 2005

(54) METHOD AND SYSTEM FOR MEASURING STRAY LIGHT

(75) Inventor: Ho-chul Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/921,164

(22) Filed: Aug. 19, 2004

(65) Prior Publication Data

US 2005/0052651 A1 Mar. 10, 2005

(30) Foreign Application Priority Data

Sep. 9, 2003 (KR) .................................. 10-2003-0063357

(51) Int. Cl.[7] .................................................. G01J 1/42
(52) U.S. Cl. ...................... 356/218; 356/237.5; 250/548
(58) Field of Search ........................... 356/237.1–237.6, 356/218, 213, 394, 239.7, 400–401; 250/548

(56) References Cited

U.S. PATENT DOCUMENTS

| | | | | |
|---|---|---|---|---|
| 5,446,542 A | * | 8/1995 | Muraoka | .................... 356/400 |
| 5,539,514 A | * | 7/1996 | Shishido et al. | ......... 356/237.4 |
| 5,783,833 A | * | 7/1998 | Sugaya et al. | ............... 250/548 |
| 6,038,038 A | * | 3/2000 | Selby et al. | ................. 358/446 |
| 6,313,913 B1 | * | 11/2001 | Nakagawa et al. | ...... 356/237.2 |

\* cited by examiner

*Primary Examiner*—Gregory J. Toatley, Jr.
*Assistant Examiner*—Sang H. Nguyen
(74) *Attorney, Agent, or Firm*—Lee, Sterba & Morse, P.C.

(57) ABSTRACT

A method and system for measuring stray light for use in an exposure apparatus uses an image sensor to be disposed at a wafer level in the exposure apparatus. The stray light is measured by preparing a reference pattern and a measuring pattern on a reticle. The reference pattern includes a light shielding region having first open regions for transmitting light to a center of an active region of the image sensor. The measuring pattern includes a light shielding region having second open regions for transmitting light to a periphery of the active region. A first intensity of light reaching the active region after being filtered by the reference pattern and a second intensity of light reaching the image sensor after being filtered by the measuring pattern are measured. The intensity of the stray light is evaluated by a difference between the first and second light intensities.

22 Claims, 7 Drawing Sheets

METHOD AND SYSTEM FOR MEASURING STRAY LIGHT

BACKGROUND OF THE INVENTION

1. Field of the Invention

The present invention relates to an exposure apparatus used for manufacturing semiconductor devices. More particularly, the present invention relates to a method of and a system for measuring stray light in an exposure apparatus.

2. Description of the Related Art

A variety of exposure apparatuses for transcribing a pattern on a wafer are used for manufacturing semiconductor devices. When using such an exposure apparatus, e.g., a photo scanner, flares caused by stray light when transcribing a reticle pattern on a wafer significantly affect performance of semiconductor devices made thereby. Therefore, it is important to minimize stray light in an exposure apparatus.

A widely used method for measuring stray light is the Kirk method. In the Kirk method, stray light is evaluated by measuring an exposure dose at which a predetermined size of an opaque pattern disappears due to the stray light.

This method allows short range stray light to be measured. Also, a light dispersion range can be obtained by measuring a variety of sizes of opaque patterns. However, in order to use opaque patterns for this purpose, a basic measurement with regard to a resist has to be made.

More particularly, after exposing a resist layer on a wafer to light filtered by the opaque pattern, the exposed resist layer on the wafer must be examined by an operator, e.g., using a microscope tester. Therefore, the process of obtaining measurement data is time consuming. Moreover, since a decision as to whether the reticle pattern should be transcribed or not depends is subjective, i.e., depends on the judgment of each individual operator, the decision could vary for the same measurement data. Therefore, accuracy and reliability of measured data are significantly affected by the operator.

SUMMARY OF THE INVENTION

The present invention is therefore directed to a method and system of measuring stray light, which substantially overcomes one or more of the problems due to the limitations and disadvantages of the related art.

It is a feature of an embodiment of the present invention to measure stray light dispersed within a few microns range in an exposure apparatus. It is another feature of an embodiment of the present invention to measure stray light dispersed within tens of microns. It is yet another feature of an embodiment of the present invention to provide fast and effectively stray light measurement without using a wafer and a resist. It is still another feature of an embodiment of the present invention to provide measurement of stray light using a sensor already employed in the exposure apparatus. It is a further feature of an embodiment of the present invention to provide objective measurement of stray light.

At least one of the above and other features and advantages of an embodiment of the present invention may be realized by providing a method of measuring stray light in an exposure apparatus including an image sensor disposed at a wafer level, including providing a reference pattern on a first reticle, the reference pattern including a light shielding region having first open regions for transmitting light, providing a measuring pattern on a second reticle, the measuring pattern including a light shielding region having second open regions for transmitting light, positioning the reference pattern over the image sensor such that the first open regions are over an active region of the image sensor, the first open regions corresponding to a center of the active region, positioning the measuring pattern over the image sensor such that the second open regions are over the active region of the image sensor, the second open regions corresponding to a periphery of the active region, measuring an intensity of a first light beam incident on the active region having been filtered by the reference pattern, measuring an intensity of a second light beam incident on the active region having been filtered by the measuring pattern, and evaluating an intensity of the stray light by an intensity difference between the first light beam and the second light beam.

The reference pattern and the measuring pattern may be independent from each other, and the first and second reticles may be the same reticle or separate reticles. Each of the first open regions and each of the second open region may have a same shape. A width of the first open region may be less than half of a width of the active region or less than ⅙ of the width of the active region. The width of the first open region may be within a range of a few microns and the width of the active region may be within a range of a few tens of microns. The number of the first and second open regions may be equal. The first open regions may be spaced apart a distance less than a width of a first open region. The second open regions may be disposed at a distance less than a width of a second open region from the boundary of the active region when positioned over the image sensor. The active region may be a square. The second open regions may be in the four corners of the square.

The image sensor may further be used for at least one of focusing and aligning a wafer during a light exposing process.

At least one of the above and other features and advantages of an embodiment of the present invention may be realized by providing a method of measuring stray light in an exposure apparatus including an image sensor disposed at a wafer level, including providing a reference pattern on a first reticle, the reference pattern including a light shielding region having first open regions for transmitting light, providing a measuring pattern on a second reticle, the measuring pattern including a light shielding region having second open regions for transmitting light, providing an opaque pattern on a third reticle, the opaque pattern having a light shielding region at least equal in size to the active region and a peripheral third open region for transmitting light, positioning the reference pattern over the image sensor such that the first open regions are over an active region of the image sensor, the first open regions corresponding to a center of the active region, measuring a first intensity of light incident on the active region filtered by the reference pattern, positioning the measuring pattern over the image sensor such that the second open regions are over the active region of the image sensor, the second open regions corresponding to a periphery of the active region, measuring a second intensity of light incident on the active region filtered by the measuring pattern, positioning the opaque pattern over the image sensor such that the opaque pattern completely shields the active region, measuring a third intensity of light incident on the active region filtered by the opaque pattern, and evaluating an intensity of the stray light in a first measuring range by taking difference between the first and second intensities, and evaluating an intensity of the stray light in a second measuring range as the third intensity, wherein the second measuring range extends from and is higher than the first measuring range.

Each of the first and second open regions may have a same shape. A width of the first open region may be within a range of a few microns and a width of the active region may be within a range of a few tens of microns. A number of the first open regions is equal to a number of the second open regions. The active region may be a square, and the second open regions may be disposed in the four corners of the square. The opaque pattern may be a square and may include the square of the active region. A width of the active region may be in a range of a few tens of microns, and the opaque pattern may be a few microns to a few tens of microns larger than the active region.

At least one of the above and other features and advantages of an embodiment of the present invention may be realized by providing a stray light measuring system, including an image sensor to be disposed in a wafer level of an exposure apparatus that is used for performing a light exposing process, the image sensor having an active region, a reference pattern including a light shielding region having first open regions, the first open regions being disposed in a center portion of the active region when the reference pattern is positioned over the active region, a measuring pattern including a light shielding region having second open regions, the second open regions being disposed in a periphery of the active region when the measuring pattern is positioned over the active region, and a measuring section that collects first intensities of light that reaches the active region after being filtered by the reference pattern and second intensities of light that reaches the active region after being filtered by the measuring pattern.

At least one of the above and other features and advantages of an embodiment of the present invention may be realized by a stray light measuring system, including an image sensor to be disposed in a wafer level of an exposure apparatus that is used for performing a light exposing process, the image sensor having an active region, a reference pattern including a light shielding region having first open regions, the first open regions being disposed in a center portion of the active region when the reference pattern is positioned over the active region, a measuring pattern including a light shielding region having second open regions, the second open regions being disposed in a periphery of the active region when the measuring pattern is positioned over the active region, and an opaque pattern including a shielding region surrounded by a third open region, the light shielding region shielding at least the active region when the opaque pattern is positioned over the active region, and a measuring section that collects first intensities of light that reaches the active region after being filtered by the reference pattern, second intensities of light that reaches the active region after being filtered by the measuring pattern, and third intensities of a light that reaches the active region after being filtered by the opaque pattern.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
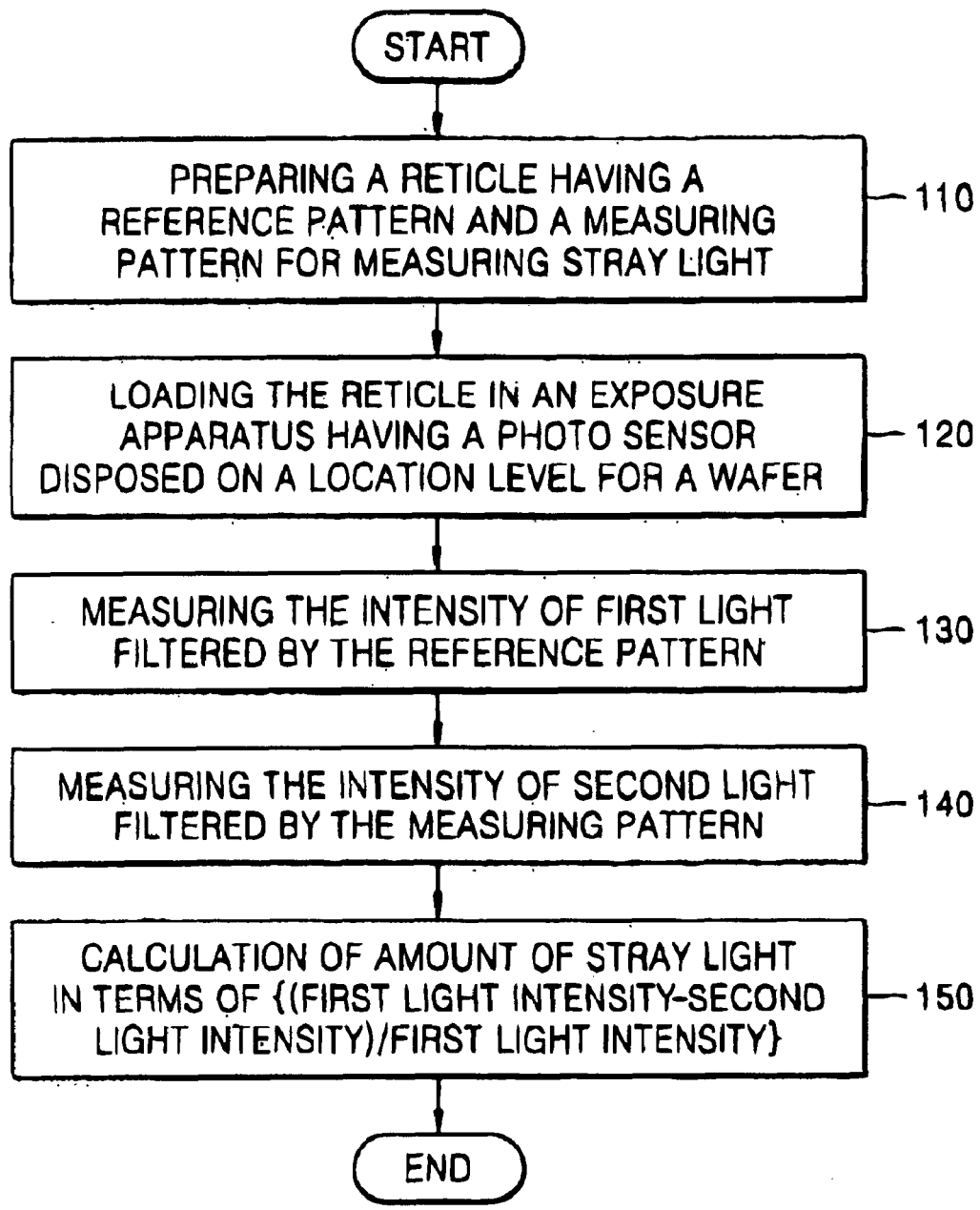
FIG. 1 is a flow diagram of a method of measuring stray light according to a first embodiment of the present invention.

Korean Patent Application No. 2003-63357, filed on Sep. 9, 2003, in the Korean Intellectual Property Office, entitled: "Method for Measuring Stray Light and Measuring System Therefor," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. Like reference numerals refer to like elements throughout.

In an embodiment of the present invention, a method of measuring stray light uses an image sensor, i.e., a photo sensor, which is disposed at a location having a level about equal that of a wafer loaded in an exposure apparatus. The image sensor disposed at the wafer level can be an image sensor used for focusing or for wafer alignment in the exposure apparatus.

When measuring stray light using the image sensor, which is also used for focusing or for wafer alignment, an intensity of the stray light can be measured without using additional parts for the exposure apparatus. Thus, the exposure apparatus does not need to be reconfigured to measure the stray light.

However, a conventional image sensor employed for focusing or for wafer alignment in the exposure apparatus has a photo sensing or active region of approximately a few tens of microns, but the range of stray light to be measured is no more than a few microns. Accordingly, when measuring stray light by simply employing a square opaque pattern, as in the Kirk method, using the conventional image sensor, more specifically, when measuring an intensity of stray light incoming through opened peripheral regions in a center of the opaque pattern, the effect of stray light within a few microns range cannot be measured.

In order to solve this problem, a new measuring pattern system is proposed in the embodiments of the present invention. The new measuring pattern system enables the stray light dispersed from a range of a few microns to be measured using an image sensor which has a sensing range of more than a few tens of microns.

Figure 2:
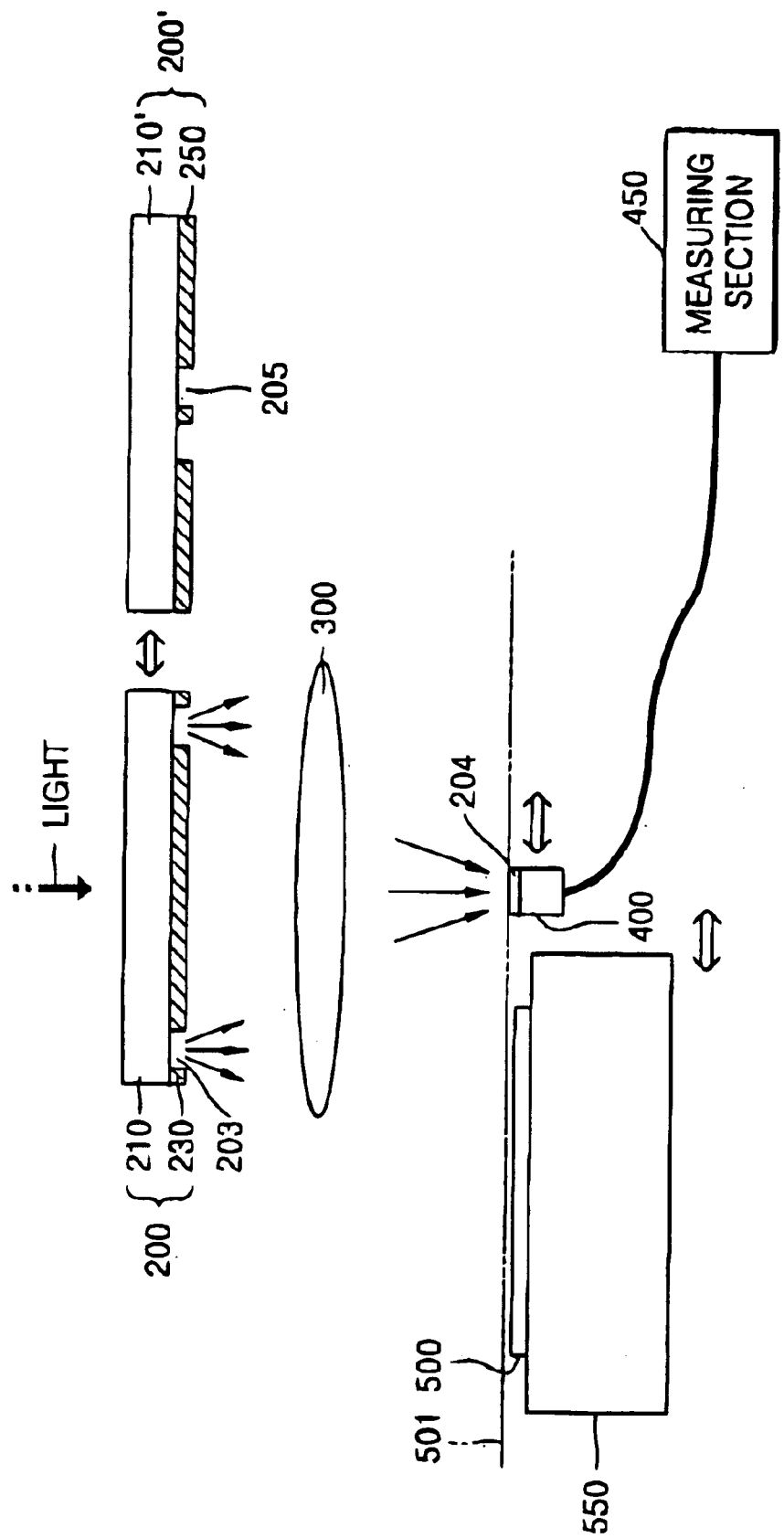
FIG. 2 illustrates a schematic diagram of an apparatus for measuring stray light according to the first embodiment of the present invention.
Figure 3A:
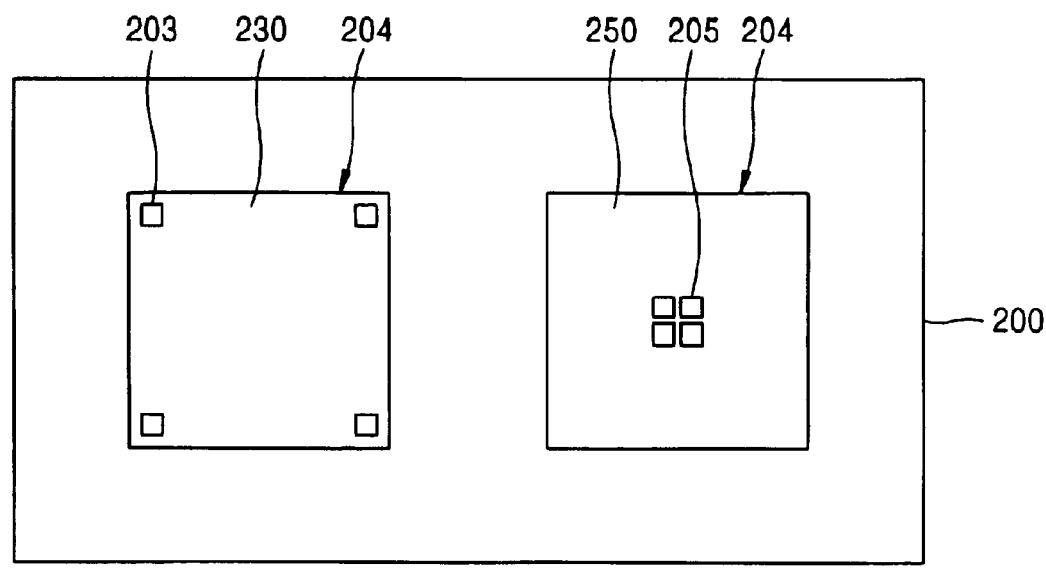
FIGS. 3A and 3B illustrate schematic diagrams of a measuring pattern system for measuring stray light according to the first embodiment of the present invention.
Figure 3B:
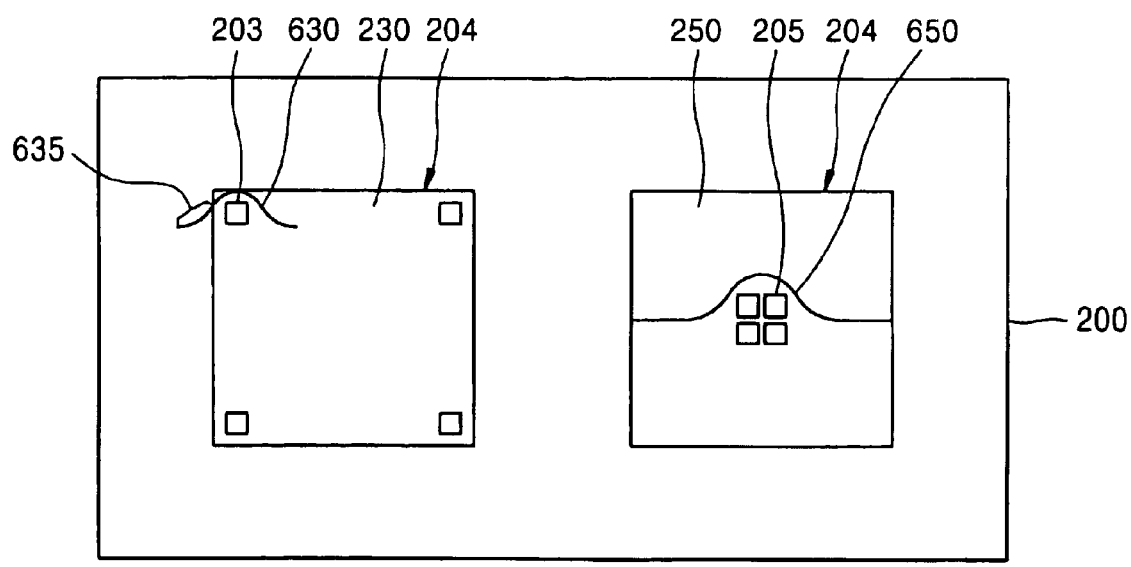

FIG. 1 is a flow diagram for describing a method of measuring stray light according to a first embodiment of the present invention. FIG. 2 illustrates a schematic diagram of an apparatus for measuring stray light according to the first embodiment of the present invention. FIGS. 3A and 3B illustrate schematic diagrams of a measuring pattern system used to measure stray light according to the first embodiment of the present invention.

Referring to FIG. 1, a reticle having a stray light measuring pattern system is prepared in step 110. The stray light measuring pattern system includes a measuring pattern and a reference pattern. The reticle is then loaded into an exposure apparatus having a photo sensor disposed at the same level as that of a wafer to be processed in step 120. Light to be used during wafer processing is incident on the reticle, and a first light intensity of a first light beam filtered by the reference pattern is measured in step 130. A second light intensity of a second light beam filtered by the measuring pattern is measured in step 140. Of course, the order of these measurement steps 130 and 149 may be reversed. An intensity of stray light is then determined in step 150 by subtracting the second light intensity from the first light intensity, and then normalizing this difference by dividing this difference by the first light intensity.

An apparatus for realizing this method is shown in FIG. 2. The apparatus includes a reticle 200 having a measuring pattern 230 having open regions 203 on a substrate 210, a reticle 200' having a reference pattern 250 having open regions 205 on a substrate 210', and an image sensor 400 having a sensing or active region 204. The reticles 200, 200' are place in an exposure system in which stray light is to be measured. The image sensor 400 is placed at the same location and level 501 as a wafer 500 on a wafer stage 550 is to be during processing. Light to be used during processing of the wafer 500 on the wafer stage 550 is incident on either reticle 200, 200' positioned between the light and the image sensor 400. The light filtered by the reticle 200, 200' may be focused by a lens system 300 onto the image sensor 400. The image sensor outputs electrical signals to a measuring section 450 in accordance with an intensity of light incident thereon. The image sensor, the wafer stage 550 and the reticles 200, 200' may all be moved relative to one another, as indicated by the arrows in FIG. 2

The image sensor 400 is primarily used for focusing and aligning the wafer 500 on the wafer stage 550 in the exposure system. For this purpose, the image sensor 400 is configured to sense a relatively large region (or spot) of light, e.g., approximately a few tens of microns or more. For focusing or aligning a wafer, a size (or width) of sensing region 204 of the image sensor 400, while varying according to the type of exposure apparatus, is generally configured to be approximately a few tens of microns or more. Accordingly, the image sensor 400 for focusing or aligning a wafer is not suitable for measuring stray light in a range of a few microns.

Of course, the image sensor 400 could be configured to measure stray light dispersed only within a range of a few microns. However, the image sensor 400 so configured could no longer be used for focusing or aligning the wafer 500. Therefore, an additional image sensor (not shown) for focusing or aligning a wafer would be required. This means that additional operational equipment for moving and aligning the additional sensor is required. When the additional equipment is included in the process, the configuration of the exposure apparatus becomes very complicated.

Therefore, in the first embodiment of the present invention, the size (or width) of the photo sensing region is relatively large, i.e., larger than needed to measure stray light, so that it can be used not only for measuring stray light, but also for focusing and aligning a wafer. That is, the width of a sensing region 204 of the image sensor 400 may be a few tens of microns, e.g., a length of a side of the square is a few tens microns with respect to the size of the reticle.

If the size of the photo sensing region 204 is a few tens of microns, the intensity data of the sensed stray light within a range of a few microns, more specifically, about 1~20 $\mu$m, and, more practically, up to about 10 $\mu$m, cannot be used for evaluating an effect of stray light. In order to solve this problem, a measuring pattern system as depicted in FIGS. 3A and 3B is introduced in accordance with the first embodiment of the present invention.

Referring to FIGS. 2, 3A, and 3B, the measuring pattern system includes patterns such as the measuring pattern 230 and the reference pattern 250. The measuring pattern 230 and the reference pattern 250 are either both formed on the transparent substrate 210 of the reticle 200 as depicted in FIG. 3A or formed on different transparent substrates 210, 210' reticles 200, 200', as depicted in FIG. 2. When the measuring pattern 230 and the reference pattern 250 are formed on the different reticles 200, 200', an operation for changing the reticles 200 during measurement is required. On the other hand, when the measuring pattern 230 and the reference pattern 250 are formed on the same reticle 200, the measuring can be performed by moving positions of the image sensor 400.

The measuring pattern 230 and the reference pattern 250 are formed to have sizes corresponding to that of the photo sensing region 204 of the image sensor 400. That is, the sizes of the measuring pattern 230 and the reference pattern 250 on the reticle 200 can be defined based on the size of the photo sensing region 204 of the image sensor 400. A planar shape of the photo sensing region 204 of the image sensor 400 in FIG. 2 may be a square. The photo sensing region 204 can be formed to have a different shape, such as a polygonal shape, but a square shape may improve accuracy for measuring stray light. In FIGS. 3A and 3B, an outline of the photo sensing or active region 204 will be provided for illustrating the relationship between the stray light sensing pattern and the active region 204 when the respective pattern is positioned over the active region 204.

The measuring pattern 230 is a light shielding or opaque layer, and has a layout in which four first open or transparent regions 203 are respectively formed in the corners of the photo sensing region 204. The shielding layer is extends beyond the photo sensing region 204, as depicted in FIG. 3A, to remove an effect of incoming stray light from the outside of the photo sensing region 204. This is more clearly seen in FIG. 2, in which only first open regions 203 in the measuring pattern 230 transmit light.

The first open regions 203 may have the same shape. The first open regions 203 are regions for transmitting light supplied from a light source of a light exposure apparatus as depicted in FIG. 2. A shape of the first open region 203 may be square.

The first open regions 203 may be disposed in a periphery, e.g., in four corners, of the photo sensing region 204 as depicted in FIG. 3A, but the first open regions may also be disposed at a predetermined distance from sides of the photo sensing region 204. A width of each of the first open regions 203 may be less than half of a width of the photo sensing region 204. For example, when the size of the photo sensing region 204 is 28 µm×28 µm, each of the first open regions 203 can be 4 µm×4 µm. That is, the size of each first open region 203 can be approximately 1/6.5 of the photo sensing region 204. In this case, the distance between each first open region 203 and a side of the photo sensing region 204 can be less than a side length of each first open region 203. For example, each first open region 203 can be disposed at a distance of approximately 1 µm from the side of the photo sensing region 204.

In addition to forming the measuring pattern 230 as mentioned above, the reference pattern 250 for measuring reference data to be used as a reference to the measured data obtained using the measuring pattern 230 is formed. Similar to the measuring pattern 230, the reference pattern 250 is formed in consideration of the size of the photo sensing region 204. That is, the reference pattern 250 is an opaque pattern, i.e., a light shielding pattern, and has a layout in which second open regions 205 may be in a center of the photo sensing region 204. The shielding pattern also extends toward an outside region of the photo sensing region 204, as depicted in FIG. 3A, to remove an effect of stray light from the outside region of the photo sensing region 204. This is more clearly seen in FIG. 2, in which only second open regions 205 in the reference pattern 250 transmit light.

As an example, the second open regions 205 of the reference pattern 250 are formed to have the same shape as the first open regions 203 of the measuring pattern 230. The same number of second open regions 205 as first open regions 203 is formed. As depicted in FIG. 3A, when the measuring pattern 230 includes square first open regions 203 disposed in the four corners of the photo sensing region 204, four second open regions 205 having the same shape as the first open regions 203 are formed. In this example, the distance between the second open regions 205 is very small, i.e., less than a side length of the second open region 205, e.g., approximately 1 µm.

In steps 120–140 of FIG. 1, the reticle 200 having the measuring pattern system, i.e., the reference pattern 250 and the measuring pattern 230, is loaded in a light exposure apparatus. The reticle 200 is exposed to light, and intensities of the light filtered by the reference pattern 250 and the measuring pattern 230 are measured independently and sequentially by the image sensor 400.

More specifically, in step 120, the reticle 200 having the measuring pattern system for measuring the stray light according to the first embodiment of the present invention is loaded into a conventional light exposure apparatus as depicted in FIG. 2. Then, light having the same characteristic as light to be used with the reticle 200 in a practical exposure process is output from a light source (not shown).

Then, in step 130, a first light intensity output from the reference pattern 250 of the reticle 200 is measured. Light incident on the reticle 200 is blocked by the reference pattern 250, except at the second open regions 205, which transmit the light. At this time, the light passing through the second open regions 205 is dispersed, generating stray light. This stray light is incident on the image sensor 400 after being converged by the lens system 300.

The image sensor 400 is placed at the same location and level 501 as the wafer 500 on the wafer stage 550, which is moved away during the stray light measurement. The intensity of light measured at the image sensor 400 is recognized as the first light intensity data output from the reference pattern 250. The first light intensity data is transmitted to the measuring section 450.

Next, in step 140, a second light intensity is measured from the measuring pattern 230 of the reticle 200. When the measuring pattern 230 and the reference pattern 250 are formed on the same reticle 200, measuring of the stray light can be sequentially performed by moving the image sensor 400. When the reference pattern 250 and the measuring pattern 230 are formed on different reticles 200, 200', measuring of the stray light can be sequentially performed with respect to each reticle 200 by switching the reticles 200, 200', e.g., unloading the first reticle 200' and then loading the second reticle 200.

The light incident on the reticle 200 is now blocked by the measuring pattern 230, except at the first open regions 203, which transmit the light. The light transmitted through the first open regions 203 is dispersed, generating stray light. The stray light is incident on the image sensor 400 after being converged by the lens system 300. The light intensity measured by the image sensor 400 is recognized as second light intensity data measured by the measuring pattern 230. The second light intensity data is transmitted to the measuring section 450 (step 140 in FIG. 1).

If there is no stray light, the intensities of light transmitted by the reference pattern and the measuring pattern should be equal. That is, the image sensor 400 senses only an intensity of light that reaches the photo sensing region 204. Since the openings in the reference pattern and the measuring pattern have the same cumulative size, they should transmit the same light intensity. Accordingly, any difference in the intensities of light sensed by the image sensor 400 regions corresponding to the second open regions 205 of the reference pattern 250 and the first open regions 203 of the measuring pattern 230 arises due to the placement of these open regions in different locations. This difference in intensity can be regarded as the intensity of stray light. In the following discussion, all light intensities are assumed to follow a conventional Gaussian distribution.

Referring to FIG. 3B, a first light beam 650 reaches the wafer level 501 after passing through the second open region 205 of the reference pattern 250. Since the second open regions 205 are disposed on the center of the photo sensing region 204 and the size of the photo sensing region 204 is much larger than the size of the second open regions 205, the photo sensing region 204 includes practically all of the first light beam 650. Accordingly, an intensity of the first light beam measured by the image sensor 400 serves as the reference intensity.

On the other hand, only a portion of a second light beam 630 passes through the first open regions 203 of the measuring pattern 230 to the wafer level 501 to be sensed by the image sensor 400, as can be seen in FIG. 3B. Since the Gaussian distribution of the light beam 630 is spread over a larger region than that of a single first opening 203, not all of the first light beam 635 will be incident on the sensor 400. However, because a sum of the areas of the first open regions 203 is equal to the sum of the areas of the second regions 205, first and second intensities measured by the sensor 400 should be practically equal. In other words, a sum of the intensities of light that have been transmitted through the four first open regions 203 should practically equal to a sum of the intensities of light that have been transmitted through the four second open regions 205.

However, since the first open regions 203 are located in the four corners of the photo sensing region 204, a tail portion 635 of the second light beam 630 that passed through the first open regions 203 is not sensed by the photo sensing region 204. That is, the tail portion 635 cannot be sensed by the image sensor 400, because the portion 635 of the light is cut out from the photo sensing region 204. The unsensed tail portion 635 of the second light 630 can be regarded as stray light. A difference between the first and second intensities arising form this cutting out can be normalized by dividing the difference by the intensity from the reference pattern. In other words, an amount or intensity of stray light with respect to the reference value can be determined by subtracting the second light intensity from the first light intensity, and dividing this difference by the first light intensity. In this way, the amount of stray light can be calculated in accordance with step 150 of FIG. 1.

Figure 4:
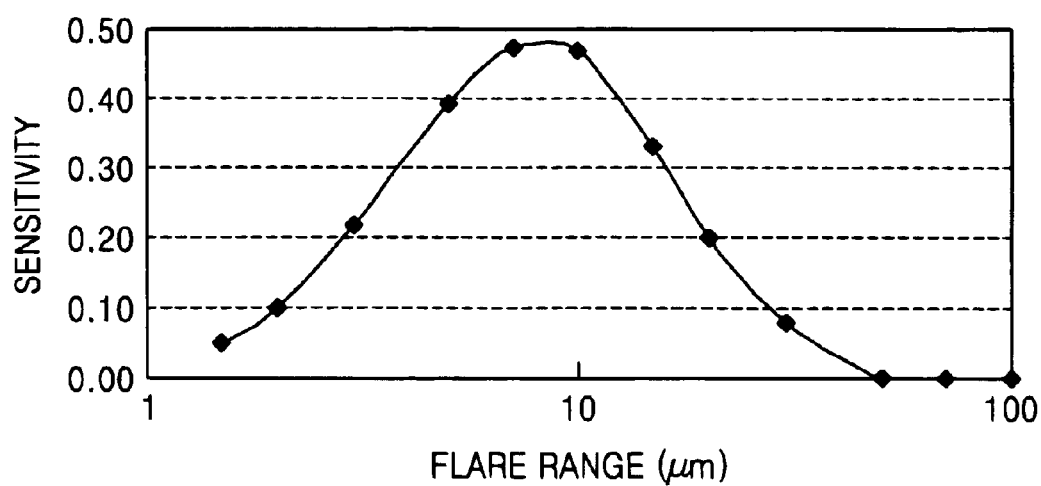
FIG. 4 is a graph showing a measured sensitivity obtained by measuring stray light according to the first embodiment of the present invention.

A measuring sensitivity of stray light can be calculated by simulation. FIG. 4 shows a graph of measuring sensitivities according to a flare range or the Gaussian distribution range obtained in accordance with the first embodiment of the present invention.

The graph of FIG. 4 was obtained using a measuring pattern system having a square photo sensitive region 204 of about 28 $\mu$m×28 $\mu$m, each of the first open region 203 and the second open region 205 being approximately a square of about 4 $\mu$m×4 $\mu$m, each of the first open regions 203 being disposed in the four corners of the photo sensitive region 204 at a distance of about 1 $\mu$m from each side of the photo sensing region 204, and the second open regions 205 being disposed in a center of the photo sensing region 204 as shown in FIGS. 3A and 3B.

At this time, it is assumed that the dispersion of light follows a Gaussian distribution. Therefore, the intensity of stray light measured according to the first embodiment of the present invention can be regarded as representing a measuring sensitivity according to the Gaussian distribution. That is, the measured intensity of light can be regarded as the sum of light intensities. The sensitivity range can be expressed as the graph shown in FIG. 4 as the result of simulation analysis.

According to FIG. 4, at the flare range or dispersion range of 10 $\mu$m, the measuring sensitivity for measuring stray light is determined by the simulation to be approximately 0.49. It can be seen from FIG. 4 that a meaningful measuring sensitivity can be obtained in the Gaussian distribution range above and below 10 $\mu$m. FIG. 4 demonstrates that the method of measuring stray light according to the first embodiment of the present invention is sensitive enough to be used for measuring light with a dispersion range or a flare range of more or less 10 $\mu$m. According to the graph in FIG. 4, the method of measuring stray light according to the first embodiment of the present invention has to some degree sensitivity capable of measuring stray light with respect to the Gaussian distribution range or flare range from a few microns to 10 $\mu$m.

As described above, the method of measuring stray light according to the first embodiment of the present invention provides meaningful measuring sensitivity to the flare range of a few microns to 10 $\mu$m. However, as shown in FIG. 4, the sensitivity remarkably decreases for a flare range of a few tens of microns. In order to overcome this drawback, a method of using an opaque pattern for measuring stray light in the flare range of a few tens of microns or more is proposed, as discussed in detail below.

Figure 5:
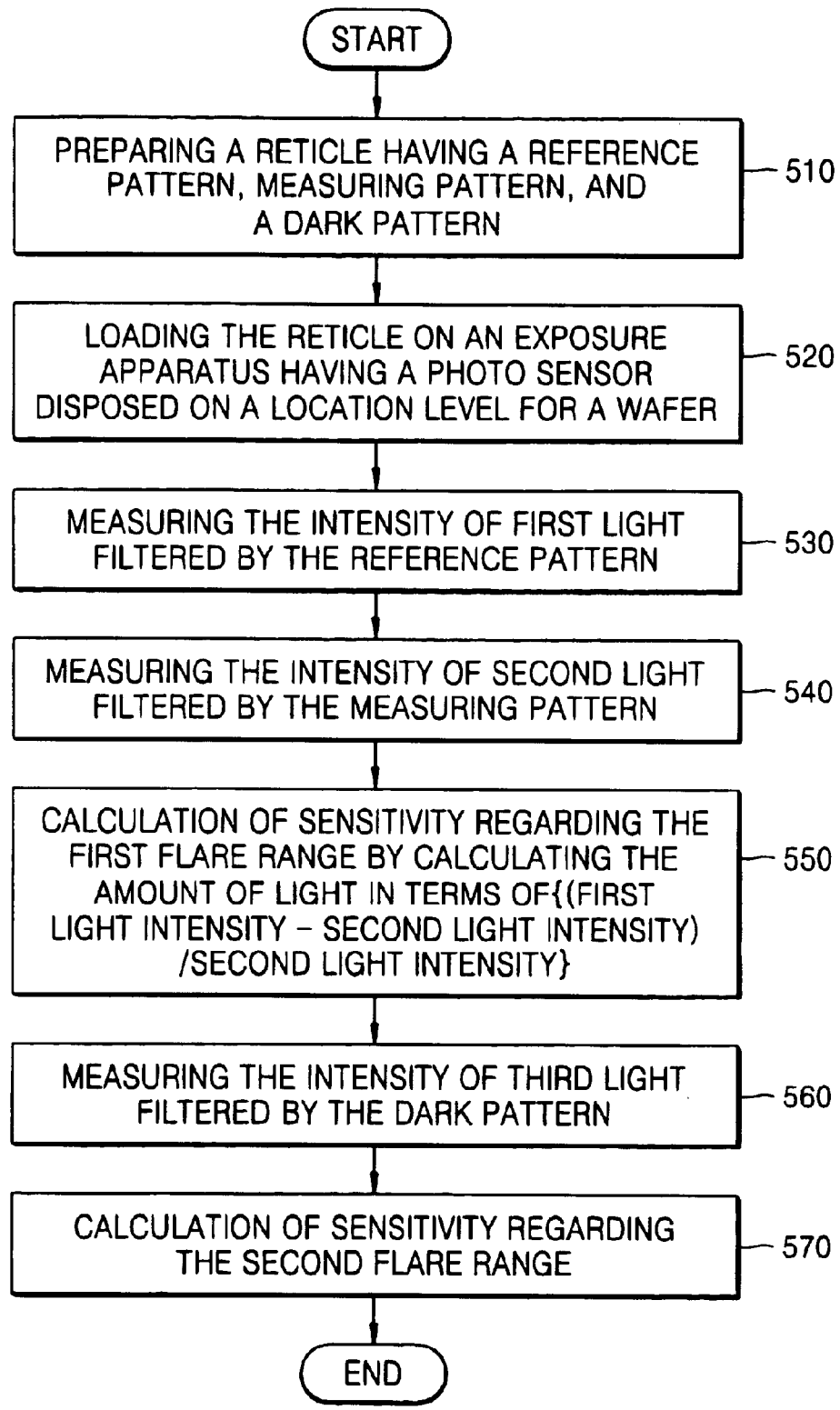
FIG. 5 is a flow diagram of a method of measuring stray light according to a second embodiment of the present invention.
Figure 6:
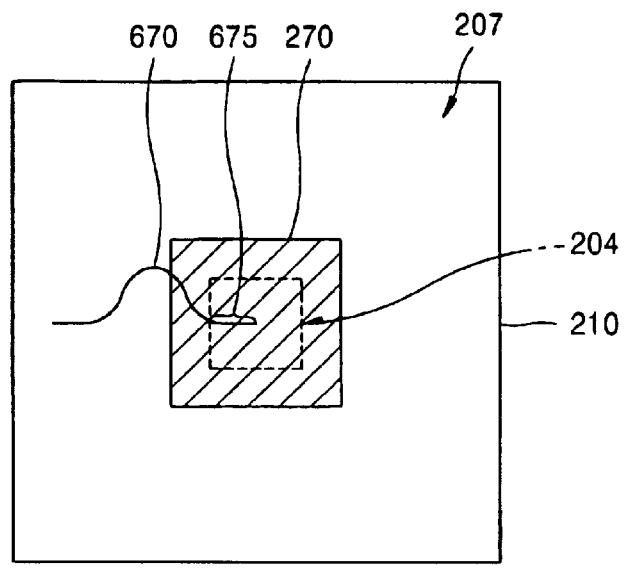
FIG. 6 illustrates a schematic diagram showing an opaque pattern employed to measure stray light according to the second embodiment and a third embodiment of the present invention.

FIG. 5 is a flow diagram of a method of measuring stray light according to a second embodiment of the present invention. FIG. 6 illustrates a schematic diagram of an opaque pattern for measuring stray light used in the second and third embodiments of the present invention.

Referring to FIG. 5, steps 510–550 are similar to steps 110–150 of FIG. 1, other than including a dark or opaque pattern on the reticle in step 510. The provision of this opaque pattern is discussed in detail regarding FIG. 6, and the remaining details of steps 510–550 are discussed above with reference to the first embodiment. In FIG. 5, a third light intensity for light filtered by the dark or opaque pattern is measured in step 560 and used to calculate a measuring sensitivity in a second flare range in step 570.

Referring to FIGS. 5 and 6, a stray light measuring pattern system having an opaque pattern 270 is formed on a transparent substrate 210 of a reticle 200, in step 510. In the second embodiment, the measuring pattern system includes the opaque pattern 270 in addition to the measuring pattern 230 and the reference pattern 250 as described with reference to FIGS. 3A and 3B. The opaque pattern 270 can be formed on the same transparent substrate 210 of the reticle 200 as the measuring pattern 230 and the reference pattern 250, or can be formed on a separate transparent substrate.

The opaque pattern 270 is surrounded by a third open or transparent region 207. The third open region 207 is a light transmitting region, while the opaque pattern 270 is a light shielding or blocking region. The opaque pattern 270 may be sufficiently large to cover the photo sensing region 204 when the opaque pattern 270 is positioned over the sensor 400.

Using the opaque pattern 270, stray light straying into the opaque pattern 270 region from the surrounding third open region 207 can be measured as intensity sensed by the image sensor 400. A third light beam 670 that strays from the third open region 207 can be assumed to follow a Gaussian distribution. Therefore, as shown in FIG. 6, the intensity or dose of light sensed by the image sensor 400 corresponds to a portion 675 of the stray light beam 670 straying into photo sensing region 204. Accordingly, the larger the opaque pattern 270, the broader the portion 675 of the stray light beam 670 sensed by the image sensor 400. Thus, as the opaque pattern 270 increases, a useful measuring sensitivity can be obtained in a broader Gaussian distribution, i.e., a broader flare range can be measured.

From the stray intensity measured in this way, as explained with reference to FIG. 4, a graph of the measuring sensitivity according to the flare range or the Gaussian distribution can be obtained by simulation.

Figure 7A:
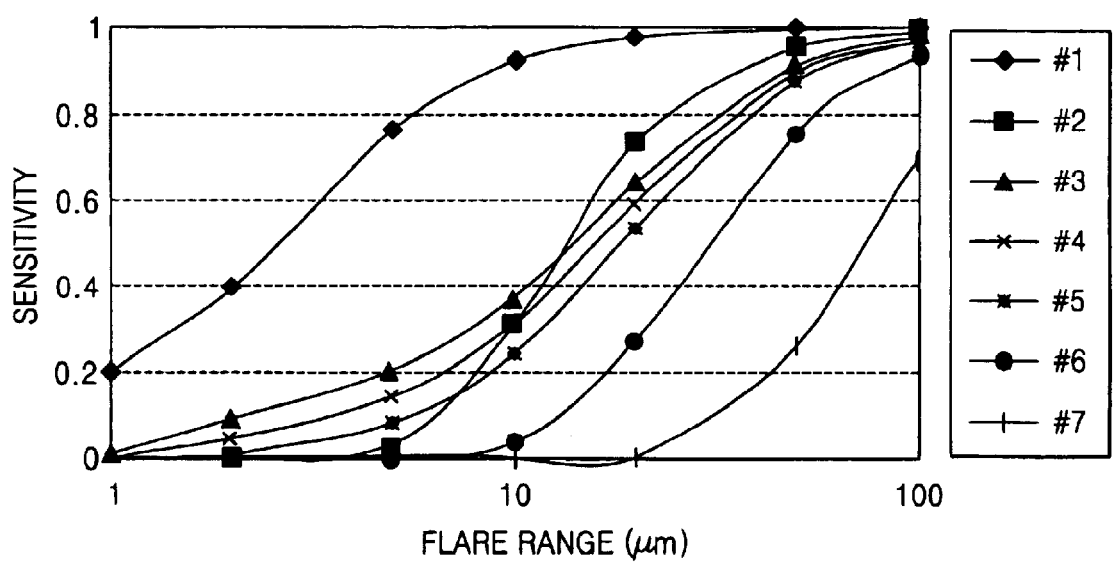
FIG. 7A is a graph of a measuring sensitivity obtained by a method of measuring stray light using an opaque pattern having varying sizes according to the third embodiment of the present invention, as well as a measuring sensitivity obtained from a conventional method.
Figure 7B:
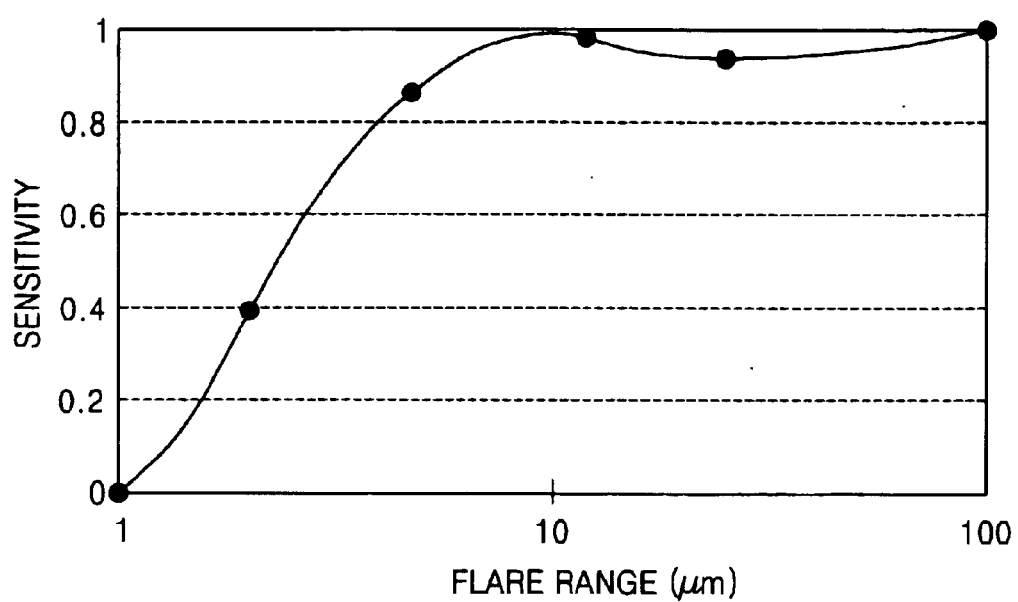
FIG. 7B is a graph of a measured sensitivity obtained by a method of measuring stray light according to the second embodiment of the present invention.

FIG. 7A is a graph of a measuring sensitivity obtained by a method of measuring stray light using only the opaque pattern of various sizes in accordance with the third embodiment of the present invention, in which only the opaque pattern is used for measuring stray light. FIG. 7A also includes measuring sensitivities achieved using a conventional method. FIG. 7B is a graph of a measuring sensitivity obtained by a method of measuring stray light according to the second embodiment of the present invention.

Referring to FIG. 7A, the measuring sensitivity obtained by simulation based on the intensity of stray light measured at the image sensor 400 using the opaque pattern 270 as shown in FIG. 6 is meaningful in the flare range of more than 10 $\mu$m.

Graphs #3 through #7 in FIG. 7A show simulation results of intensity of stray light sensed using the opaque pattern 270 depicted in FIG. 6, assuming that the stray light follows a Gaussian distribution. That is, as described with reference to FIG. 4, the measured intensity can be understood as the sum of the light intensities of the Gaussian distribution.

At this time, as in the first embodiment, the photo sensing region 204 was a square of 28 $\mu$m×28 $\mu$m, and the opaque pattern 270 was a square of 28 $\mu$m×28 $\mu$m for graph #3, 30

μm×30 μm for graph #4, 33 μm×33 μm for graph #5, 48 μm×48 μm for graph #6, and 108 μm×108 μm for graph #7.

Referring to graphs #3 through #7 in FIG. 7A, a meaningful measuring sensitivity can be obtained in the flare range of over 10 μm. Compared to the graph in FIG. 4, the measuring sensitivity values in graphs #3 through #7 above 10 μm are almost double the value shown in FIG. 4. In the case of the measuring pattern 230 used for obtaining the FIG. 4, the measuring sensitivity was simulated with respect to the sensitivity obtained using the formula {(first light intensity-second light intensity)/first light intensity}.

That is, since the first open regions 203 are located in the four corners of the photo sensing region 204, the second light intensity is only half of the intensity stray light sensed by the dark pattern 270. Therefore, the measuring sensitivity value in FIG. 7A in the range above 10 μm is practically equal to twice the value of the measuring sensitivity in FIG. 4.

When compared to the graph in FIG. 4 and the graphs #3 through #7 in FIG. 7A, it can be seen that the graphs are mutually supplemented. That is, the method of measuring stray light using the measuring pattern 230 and the reference pattern 250 alone as described in the first embodiment is advantageous for measuring sensitivity in the flare range (or Gaussian distribution) of approximately 10 μm or less, and the method of measuring a stray light using the opaque pattern 270 alone as in the third embodiment is advantageous for measuring sensitivity in a flare range of over 10 μm.

From this point of view, when combining the graph in FIG. 4 and the graph #4 in FIG. 7A, a measuring sensitivity graph as depicted in FIG. 7B can be obtained in accordance with the second embodiment of the present invention. The graph in FIG. 7B is combined in such a way that a doubled measuring sensitivity value from the graph in FIG. 4 is added to a corresponding measuring sensitivity value of the graph #4 in FIG. 7A.

Referring to FIG. 7B, a method of measuring stray light with high measuring sensitivities in flare ranges from a few microns to a few tens of microns can be provided in accordance with the second embodiment of the present invention by sequentially performing the method of measuring stray light using the measuring pattern 230 and the reference pattern 250 according to the first embodiment, and using the method of measuring stray light using the opaque pattern 270 according to the third embodiment.

Referring to FIG. 7A, the graphs #1 and #2 are graphs of measuring sensitivities obtained by the Kirk method, that is, a method of evaluating a stray light by measuring a light dose at which the opaque pattern disappears after transcribing a predetermined size of a opaque pattern on a conventional wafer. The size of the opaque pattern for graph #1 is of dimensions 5 μm×5 μm and for graph #2 is of dimensions 20 μm×20 μm. It is seen that, in the case of graph #1, useful measuring sensitivities can be obtained in flare ranges from a few microns to a few tens of microns. However, the method of evaluating the stray light based on such resist has several problems, as noted above in the Background of the Invention.

When comparing the graph FIG. 7B to the graph #1 in FIG. 7A, it is seen that both graphs have a similar shape. This means that the method of measuring stray light according to the embodiments of the present invention can also be used to obtain a useful measuring sensitivity in flare ranges from a few microns to a few tens of microns, more effectively than a conventional method that includes a complicated process.

Referring to the graph #3 through #7 in FIG. 7A, for measuring stray light using the opaque pattern according to the second embodiment of the present invention, it is seen that the bigger the opaque pattern 270, the more useful it is to measure broader flare ranges, while the smaller the opaque pattern 270, the less useful it is to measure smaller flare ranges. However, the size of the opaque pattern 270 should not be smaller than the size of the photo sensing region 204. Also, if the image sensor 400 is as small as a few microns as described with reference to FIG. 2, there is a drawback in that the image sensor 400 cannot be used for focusing or wafer alignment purposes.

In conclusion, as shown in FIG. 5, the method of measuring stray light according to the second embodiment of the present, includes preparing the stray light measuring reticle 200 having the measuring pattern system which includes the measuring pattern 230 and/or the reference pattern 250, and/or the opaque pattern 270 in step 510, loading the reticle 200 to an exposure apparatus in which an image sensor 400 as a photo sensor is disposed at a wafer level 501 in step 520; and, as described in the first embodiment, measuring a first light intensity filtered by the reference pattern 250 in step 530, and measuring a second light intensity filtered by the measuring pattern 230 in step 540.

The intensity of stray light in the first flare range can be calculated as described in the first embodiment in step 550 from the relationship of {(first light intensity—second light intensity)/first light intensity or dose}. An intensity of stray light or a measuring sensitivity value in the first flare range, i.e., from a few microns to 10 μm, can be obtained.

As explained with reference to FIG. 6, by measuring a third light intensity of light filtered by the opaque pattern 270 using the image sensor 400 in step 560, an intensity of stray light or a measuring sensitivity value in the second flare range which is larger range than the first flare range, i.e., from 10 μm to more than a few tens of microns, can be obtained ins step 570.

According to the present invention, an amount or intensity of light dispersed in a range of a few microns can be measured by comparing the intensity of light transmitted through a measuring pattern and a reference pattern using an image sensor as a photo sensor disposed at a wafer level 501 in an exposure apparatus. This method has the advantages of providing a fast measurement, high accuracy, and high reproducibility since the evaluation of the stray light is based on objective information, i.e., intensities detected by an image sensor. The methods of the present invention do not require a wafer and resist, and remove the subjective variation caused by the decision of a test operator in the conventional method.

Stray light dispersed in a very narrow range compared to the photo sensing region can be measured by measuring a degree of stray light from intensity differences between the filtered light intensity of the measuring pattern and the reference pattern. That is, even though the photo sensing region 204 has a width of a few tens of microns, a flare effect in a range of a few microns or less can be measured and evaluated.

By sequentially performing the first measurement using the measuring pattern and the reference pattern and the second measurement using the opaque pattern, a method of measuring stray light with high measuring sensitivities in a range from a few microns to a few tens of microns or more can be provided. These methods are easy to perform and the results of measurement are correct with high reproducibility because the intensities of filtered light are measured using an image sensor The image sensors according to the present invention can also be used for focusing light on a wafer or for wafer alignment of a semiconductor device. Accordingly, there is no need to restructure an existing exposure apparatus by adding new parts for measuring stray light. Thus, simple and economical measurement of stray light can be realized in accordance with the present invention.

Exemplary embodiments of the present invention have been disclosed herein and, although specific terms are employed, they are used and are interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of measuring stray light in an exposure apparatus including an image sensor disposed at a wafer level, comprising:
   providing a reference pattern on a first reticle, the reference pattern including a light shielding region having first open regions for transmitting light;
   providing a measuring pattern on a second reticle, the measuring pattern including a light shielding region having second open regions for transmitting light;
   positioning the reference pattern over the image sensor such that the first open regions are over an active region of the image sensor, the first open regions corresponding to a center of the active region;
   positioning the measuring pattern over the image sensor such that the second open regions are over the active region of the image sensor, the second open regions corresponding to a periphery of the active region;
   measuring an intensity of a first light beam incident on the active region having been filtered by the reference pattern;
   measuring an intensity of a second light beam incident on the active region having been filtered by the measuring pattern; and
   evaluating an intensity of the stray light by an intensity difference between the first light beam and the second light beam.

2. The method as claimed in claim 1, wherein the reference pattern and the measuring pattern are independent from each other, and the first and second reticles are a same reticle.

3. The method as claimed in claim 1, wherein the reference pattern and the measuring pattern are independent from each other, and the first and second reticles are different reticles.

4. The method as claimed in claim 1, wherein each of the first open regions and each of the second open regions have a same shape.

5. The method as claimed in claim 4, wherein a width of the first open region is less than half of a width of the active region.

6. The method as claimed in claim 5, wherein the width of the first open region is less than 1/6 of the width of the active region.

7. The method as claimed in claim 5, wherein the width of the first open region is within a range of a few microns and the width of the active region is within a range of a few tens of microns.

8. The method as claimed in claim 4, wherein a number of the first open regions is equal to a number of the second open regions.

9. The method as claimed in claim 8, wherein the first open regions are spaced apart a distance less than a width of a first open region.

10. The method as claimed in claim 1, wherein the second open regions are disposed at a distance less than a width of a second open region from the boundary of the active region when positioned over the image sensor.

11. The method as claimed in claim 1, wherein the active region is a square.

12. The method as claimed in claim 11, wherein the second open regions are in four corners of the square.

13. The method as claimed in claim 1, wherein the image sensor is further used for at least one of focusing and aligning a wafer during a light exposing process.

14. A method of measuring stray light in an exposure apparatus including an image sensor disposed at a wafer level, comprising:
   providing a reference pattern on a first reticle, the reference pattern including a light shielding region having first open regions for transmitting light;
   providing a measuring pattern on a second reticle, the measuring pattern including a light shielding region having second open regions for transmitting light;
   providing an opaque pattern on a third reticle, the opaque pattern having a light shielding region at least equal in size to the active region and a peripheral third open region for transmitting light;
   positioning the reference pattern over the image sensor such that the first open regions are over an active region of the image sensor, the first open regions corresponding to a center of the active region;
   measuring a first intensity of light incident on the active region filtered by the reference pattern;
   positioning the measuring pattern over the image sensor such that the second open regions are over the active region of the image sensor, the second open regions corresponding to a periphery of the active region;
   measuring a second intensity of light incident on the active region filtered by the measuring pattern;
   positioning the opaque pattern over the image sensor such that the opaque pattern completely shields the active region;
   measuring a third intensity of light incident on the active region filtered by the opaque pattern; and
   evaluating an intensity of the stray light in a first measuring range by taking difference between the first and second intensities, and evaluating an intensity of the stray light in a second measuring range as the third intensity, wherein the second measuring range extends from and is higher than the first measuring range.

15. The method as claimed in claim 14, wherein each of the first open regions and each of the second open regions have a same shape.

16. The method as claimed in claim 15, wherein a width of the first open region is within a range of a few microns and a width of the active region is within a range of a few tens of microns.

17. The method as claimed in claim 15, wherein a number of the first open regions is equal to a number of the second open regions.

18. The method as claimed in claim 14, wherein the active region is a square, and the second open regions are disposed in four corners of the square.

19. The method as claimed in claim 18, wherein the opaque pattern is a square and includes the square of the active region.

20. The method as claimed in claim 14, wherein a width of the active region is in a range of a few tens of microns, and the opaque pattern is a few microns to a few tens of microns larger than the active region.

21. A stray light measuring system, comprising:

an image sensor to be disposed at a wafer level of an exposure apparatus that is used for performing a light exposing process, the image sensor having an active region;

a reference pattern including a light shielding region having first open regions, the first open regions being disposed in a center portion of the active region when the reference pattern is positioned over the active region;

a measuring pattern including a light shielding region having second open regions, the second open regions being disposed in a periphery of the active region when the measuring pattern is positioned over the active region; and a measuring section that collects first intensities of light that reaches the active region after being filtered by the reference pattern and second intensities of light that reaches the active region after being filtered by the measuring pattern.

22. A stray light measuring system, comprising:

an image sensor to be disposed at a wafer level of an exposure apparatus that is used for performing a light exposing process, the image sensor having an active region;

a reference pattern including a light shielding region having first open regions, the first open regions being disposed in a center portion of the active region when the reference pattern is positioned over the active region;

a measuring pattern including a light shielding region having second open regions, the second open regions being disposed in a periphery of the active region when the measuring pattern is positioned over the active region; and an opaque pattern including a shielding region surrounded by a third open region, the light shielding region shielding at least the active region When the opaque pattern is positioned over the active region; and a measuring section that collects first intensities of light that reaches the active region after being filtered by the reference pattern, second intensities of light that reaches the active region after being filtered by the measuring pattern, and third intensities of a light that reaches the active region after being filtered by the opaque pattern.

* * * * *